(12) United States Patent
Suzuki

(10) Patent No.: US 7,626,627 B2
(45) Date of Patent: Dec. 1, 2009

(54) PHOTOELECTRIC CONVERSION LAYER STACK TYPE COLOR SOLID-STATE IMAGING DEVICE

(75) Inventor: Nobuo Suzuki, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 343 days.

(21) Appl. No.: 11/763,575

(22) Filed: Jun. 15, 2007

(65) Prior Publication Data
US 2007/0291144 A1 Dec. 20, 2007

(30) Foreign Application Priority Data
Jun. 15, 2006 (JP) ............................. 2006-166105

(51) Int. Cl.
H04N 3/14 (2006.01)
H01L 29/78 (2006.01)
(52) U.S. Cl. ...................................... 348/308; 257/440
(58) Field of Classification Search ................... None
See application file for complete search history.

(56) References Cited

U.S. PATENT DOCUMENTS 7,129,466 B2 * 10/2006 Iwasaki .................. 250/214.1
7,419,844 B2 * 9/2008 Lee et al. ....................... 438/48
7,498,624 B2 * 3/2009 Suzuki ......................... 257/292

FOREIGN PATENT DOCUMENTS

| JP | 2002-502120 T | 1/2002 |
| JP | 2002-083946 A | 3/2002 |
| JP | 2002-513145 T | 5/2002 |
| JP | 2003-332551 A | 11/2003 |
| WO | 99/39372 A2 | 8/1999 |
| WO | 99/56097 A1 | 11/1999 |

* cited by examiner

Primary Examiner—Justin P Misleh
(74) Attorney, Agent, or Firm—Sughrue Mion, PLLC

(57) ABSTRACT

A color solid state imaging device as defined herein, which includes an output signal processing section including: signal memory means provided for respective columns of the unit pixels, for holding signals read-out from the pixels of the same color of the same unit pixel row, respectively; and row-direction scanning control means for switching between an all pixels reading operation in which the signals held by the respective signal memory means are read out individually and output to the outside and a sum reading operation in which among the signals held by the respective signal memory means signals held by signal memory means corresponding to adjoining unit pixels are read out simultaneously and output to the outside.

17 Claims, 9 Drawing Sheets

|  | 4I-3 | 4I-2 | 4I-1 | 4I |
|---|---|---|---|---|
| 2J-1 | R | B | R | B |
| 2J | B | R | B | R |

PHOTOELECTRIC CONVERSION LAYER STACK TYPE COLOR SOLID-STATE IMAGING DEVICE

FIELD OF THE INVENTION

The present invention relates to a photoelectric conversion layer stack type color solid state imaging device in which incident light of one of the three primary colors is detected by a photoelectric conversion layer laid above a semiconductor substrate and incident light of the other two colors that has passed through the photoelectric conversion layer is separated into respective spectral components with color filters and detected by photoelectric conversion elements (photodiodes) formed in the semiconductor substrate. In particular, the invention relates to a photoelectric conversion layer stack type color solid-state imaging device capable of taking color images having high image quality even in shooting of dark scenes.

BACKGROUND OF THE INVENTION

In single-plate color solid-state imaging devices as typified by CMOS image sensors, three or four kinds of color filters are arranged in mosaic form on a large number of photoelectric conversion pixels that are arranged on a semiconductor substrate. With this structure, color signals corresponding to the color filters are output from the pixels, respectively, and a color image is generated by performing signal processing on those color signals.

However, color solid-state imaging devices in which color filters of the primary colors are arranged in mosaic form have a problem that they are low in efficiency of light utilization and sensitivity because ⅔ of incident light is absorbed by the color filters. The fact that each pixel produces a color signal of only one color raises a problem of low resolution. In particular, false colors appear noticeably.

To solve the above problems, imaging devices having a structure that photoelectric conversion layers are laminated in three layers on a semiconductor substrate on which signal reading circuits are formed are being studied and developed (refer to JP-T-2002-502120 (The symbol "JP-T" as used here in means a published Japanese translation of a PCT patent application.) (corresponding to WO 99/39372) and JP-A-2002-83946, for example). For example, these imaging devices have a pixel structure that photoelectric conversion layers which generate signal charges (electrons or holes) in response to blue (B) light, green (G) light, and red (R) light are laid in this order from the light incidence surface. Furthermore, these imaging devices are provided with signal reading circuits capable of independently reading, on a pixel-by-pixel basis, signal charges generated by the photoelectric conversion layers.

In the imaging devices having the above structure, almost all of incident light is photoelectrically converted into signal charges to be read and hence the efficiency of utilization of visible light is close to 100%. Furthermore, since respective pixels produce color signals of the three colors (R, G, and B), these imaging devices can generate good, high-resolution images (no false colors appear noticeably) with high sensitivity.

In the imaging device disclosed in JP-T-2002-513145 (corresponding to WO 99/56097), triple wells (photodiodes) for detecting optical signals are formed in a silicon substrate and signals having different spectra (i.e., having peaks at B (blue), G (green), and R (red) wavelengths in this order from the surface) are obtained so as to correspond to different depths in the silicon substrate. This utilizes the fact that the distance of entrance of incident light into the silicon substrate depends on the wavelength. Like the imaging devices disclosed in JP-T-2002-502120 (corresponding to WO 99/39372) and JP-A-2002-83946, this imaging device can produce good, high-resolution images (no false colors appear noticeably) with high sensitivity.

However, in the imaging devices disclosed in JP-T-2002-502120 (corresponding to WO 99/39372) and JP-A-2002-83946, it is necessary that the photoelectric conversion layers be formed in order in three layers on the semiconductor substrate and vertical interconnections be formed which transmit R, G, and B signal charges generated in the respective photoelectric conversion layers to the signal reading circuits formed on the semiconductor substrate. As such, these imaging devices have problems that they are difficult to manufacture and they are costly because of low production yields.

On the other hand, the imaging device disclosed in JP-T-2002-513145 (corresponding to WO 99/56097) is configured in such a manner that blue light is detected by the shallowest photodiodes, red light is detected by the deepest photodiodes, and green light is detected by the intermediate photodiodes. However, the shallowest photodiodes, for example, also generate photocharges when receiving green or red light, as a result of which the spectra of R, G, and B signals are not separated sufficiently from each other. Therefore, to obtain true R, G, and B signals, it is necessary to perform addition/subtraction processing on output signals of the photodiodes, which means a heavy computation load. Another problem is that the addition/subtraction processing lowers the S/N ratios of the image signals.

The imaging device disclosed in JP-A-2003-332551 has been proposed as one capable of solving the problems of the imaging devices of JP-T-2002-502120 (corresponding to WO 99/39372), JP-A-2002-83946 and JP-T-2002-513145 (corresponding to WO 99/56097). This imaging device is a hybrid type of the imaging devices of JP-T-2002-502120 (corresponding to WO 99/39372) and JP-A-2002-83946 and the imaging device of JP-T-2002-513145 (corresponding to WO 99/56097) and is configured as follows. Only a photoelectric conversion layer (one layer) that is sensitive to green (G) light is laid on a semiconductor substrate and, as in the previous image sensors, incident light of blue (B) and red (R) that has passed through the photoelectric conversion layer is detected by two sets of photodiodes that are formed in the semiconductor substrate so as to be arranged in its depth direction (see FIG. 5 of JP-A-2003-332551) or in the same plane (see FIG. 6(b) of JP-A-2003-332551).

That is, in the hybrid color solid-state imaging device, each of a large number of unit pixels which are arranged in the surface layer of the semiconductor substrate is provided with a blue-detecting photodiode (photoelectric conversion element; hereinafter referred to as "B pixel") and a red-detecting photodiode (photoelectric conversion element; hereinafter referred to as "R pixel") and a green-detecting photoelectric conversion layer (hereinafter referred to as "G pixel"). Since each unit pixel has an R pixel, a B pixel, and a G pixel, three signal reading circuits for reading signals of the respective colors and outputting those to the outside are formed for each unit pixel.

The known signal reading circuits used in conventional CMOS image sensors can be used as they are as the above signal reading circuits (charge detecting circuits). Each of these signal reading circuits is composed of transistors and classified into two types. FIG. 11A shows a signal reading circuit which is composed of three transistors (i.e., an output transistor 11, a row selection transistor 12, and a reset transistor 13) FIG. 11B shows a signal reading circuit which is composed of four transistors (i.e., an output transistor 11, a row selection transistor 12, a reset transistor 13, and a read transistor 14).

The hybrid photoelectric conversion layer stack type color solid-state imaging device having the above structure has advantages that the manufacturing process is simplified and cost increase or yield reduction can be avoided because it is sufficient to form only one photoelectric conversion layer. Furthermore, since only little light is rendered useless, this hybrid imaging device has other advantages that the efficiency of light utilization is increased and hence images can be taken with high sensitivity.

SUMMARY OF THE INVENTION

In cameras using a high-resolution imaging device, a still image is taken at as high a resolution as attained by silver salt films and a moving image is taken at as low a rate of 30 frames/sec as employed in television. However, in imaging devices having more than two million pixels, it is difficult to read color signals of all the pixels in $\frac{1}{30}$ second.

Therefore, in cameras using a conventional CCD image sensor or CMOS image sensor, whereas in taking a still image still image data are generated by reading color signals of all the pixels in taking a moving image imaging of 30 frames/sec is realized by selecting only part of the pixel rows and reading only image signals of the selected pixel rows.

If this moving image taking method is applied to the hybrid photoelectric conversion layer stack type color solid-state imaging device which is high in efficiency of light utilization and can perform high-sensitivity shooting, pixel signals of unselected pixel rows do not contribute to formation of a moving image. This means a problem that the imaging device substantially performs only low-sensitivity imaging though being capable of high-sensitivity imaging.

When a still image is taken with the hybrid photoelectric conversion layer stack type color solid-state imaging device, a still image having high image quality (i.e., a large S/N ratio) can be taken even in shooting a dark scene by causing the camera to emit flash light. However, since flash light cannot be used in taking a moving image, the image quality of a moving image of a dark scene becomes very low.

In the case of shooting at a place where the use of flash light is prohibited or shooting of a far scene in which case flashlight is not effective, a still image taken of a dark scene becomes low in image quality like a moving image.

An object of the present invention is to provide a hybrid photoelectric conversion layer stack type color solid-state imaging device capable of producing an image having high image quality even in shooting of a dark scene.

The invention provides a photoelectric conversion layer stack type color solid state imaging device including a semiconductor substrate and plural unit pixels of two kinds that are a first kind and a second kind arranged like a two-dimensional array, in which each unit pixel of the first kind consists of a pixel of a first color and a pixel of a second color for detecting incident light quantities of the first color and the second color, respectively, and each unit pixel of the second kind consists of a pixel of the first color and a pixel of a third color for detecting incident light quantities of the first color and the third color, respectively, the pixels of the first color are formed in a photoelectric conversion layer provided above the semiconductor substrate, the pixels of the second color and the pixels of the third color are formed by respective photodiodes provided in the semiconductor substrate, and detection signals of the pixels of the first color, the second color, and the third color are read-out by sets of signal reading circuits which are provided on the semiconductor substrate for the respective unit pixels, characterized by comprising an output signal processing section which comprises:

signal memory means provided for respective columns of the unit pixels, for holding signals read-out from the pixels of the same color of the same unit pixel row, respectively; and row-direction scanning control means for switching between an all pixels reading operation in which the signals held by the respective signal memory means are readout individually and output to the outside and a sum reading operation in which among the signals held by the respective signal memory means signals held by signal memory means corresponding to adjoining unit pixels are read out simultaneously and output to the outside.

The photoelectric conversion layer stack type color solid state imaging device according to the invention is characterized in that plural signal memory means are provided for each unit pixel column, and that the output signal processing section further comprises memory means changeover switches for causing the plural signal memory means to hold signals that are read-out from pixels of the same color that are adjacent to each other in a column direction of the unit pixels.

The photoelectric conversion layer stack type color solid state imaging device according to the invention is characterized in that each of the signal memory means comprises first signal memory means for holding a signal containing reset noise read-out from a pixel and a second signal memory means for holding a reset noise signal read-cut from the pixel, and that the output signal processing section outputs a difference signal of a signal read from the first signal memory means and a signal read from the second signal memory means.

The photoelectric conversion layer stack type color solid state imaging device according to the invention is characterized in that each of the signal reading circuits for reading detection signals of the pixels of the first color is formed by three transistors which are a reset transistor, a row selection transistor, and an output transistor, and each of the signal reading circuits for reading detection signals of the pixels of the second color and each of the signal reading circuits for reading detection signals of the pixels of the third color are formed by four transistors which are a read transistor, a reset transistor, a row selection transistor, and an output transistor.

The photoelectric conversion layer stack type color solid state imaging device according to the invention is characterized in that the output signal processing section further comprises switching means for taking in one of output signals of the signal reading circuits for reading detection signals of the pixels of the first color and output signals of the signal reading circuits for reading detection signals of the pixels of the second color or the third color by selecting them by switching.

The photoelectric conversion layer stack type color solid state imaging device according to the invention is characterized in that the output signal processing section further comprises circuits for performing sample-and-hold processing on detection signals of the pixels of the first color that have been taken in and circuits for performing correlation double sampling on detection signals of the pixels of the first color and the second color that have been taken in.

The photoelectric conversion layer stack type color solid state imaging device according to the invention is characterized in that the correlation double sampling is performed by clamp circuits for clamping input signals and sample-and-hold circuits for sample-and-holding outputs of the clamp circuits and the sample-and-hold processing is performed by the sample-and-hold circuits with the clamp circuits bypassed by bypass circuits.

The photoelectric conversion layer stack type color solid state imaging device according to the invention is characterized in that after the signal reading circuits have supplied detection signals of the pixels of the first color to the output signal processing section before the signal reading circuits read next detection signals of the pixels of the first color, the signal reading circuits supply reset noise signals to the output signal processing section.

The photoelectric conversion layer stack type color solid-state imaging device according to the invention is characterized in that the row selection transistor of each of the 4-transistor signal reading circuits is omitted and instead a voltage applied to a drain terminal of the reset transistor is controlled variably.

The photoelectric conversion layer stack type color solid-state imaging device according to the invention is characterized in that the photoelectric conversion layer has a structure that a single-layer or multilayer organic semiconductor layer is sandwiched between a transparent pixel electrode layer and a transparent counter electrode layer.

The photoelectric conversion layer stack type color solid-state imaging device according to the invention is characterized in that first color filters that transmit light of the second color are laid over the photodiodes for the pixels of the second color and second color filters that transmit light of the third color are laid over the photodiodes for the pixels of the third color.

The photoelectric conversion layer stack type color solid-state imaging device according to the invention is characterized in that the first color filters or the second color filters are transparent layers.

The photoelectric conversion layer stack type color solid-state imaging device according to the invention is characterized in that the first color, the second color, and the third color are green, blue, and red, respectively.

The photoelectric conversion layer stack type color solid-state imaging device according to the invention is characterized in that the pixels of the first color, the second color, and the third color detect incident light quantities as amounts of electrons.

The photoelectric conversion layer stack type color solid-state imaging device according to the invention is characterized in that the pixels of the first color detect incident light quantities as amounts of holes, and the pixels of the second color and the third color detect incident light quantities as amounts of electrons.

The photoelectric conversion layer stack type color solid-state imaging device according to the invention is characterized in that output signals of the signal processing sections are analog signals.

The photoelectric conversion layer stack type color solid-state imaging device according to the invention is characterized in that output signals of the output signal processing sections are digital signals.

The invention makes it possible to produce image signals having a large S/N ratio with high sensitivity because image signals can be output through signal addition (pixel addition) in shooting in which the use of flash light is prohibited, in taking of a moving image, or in a like situation.

DESCRIPTION OF SYMBOLS

Figure 1:
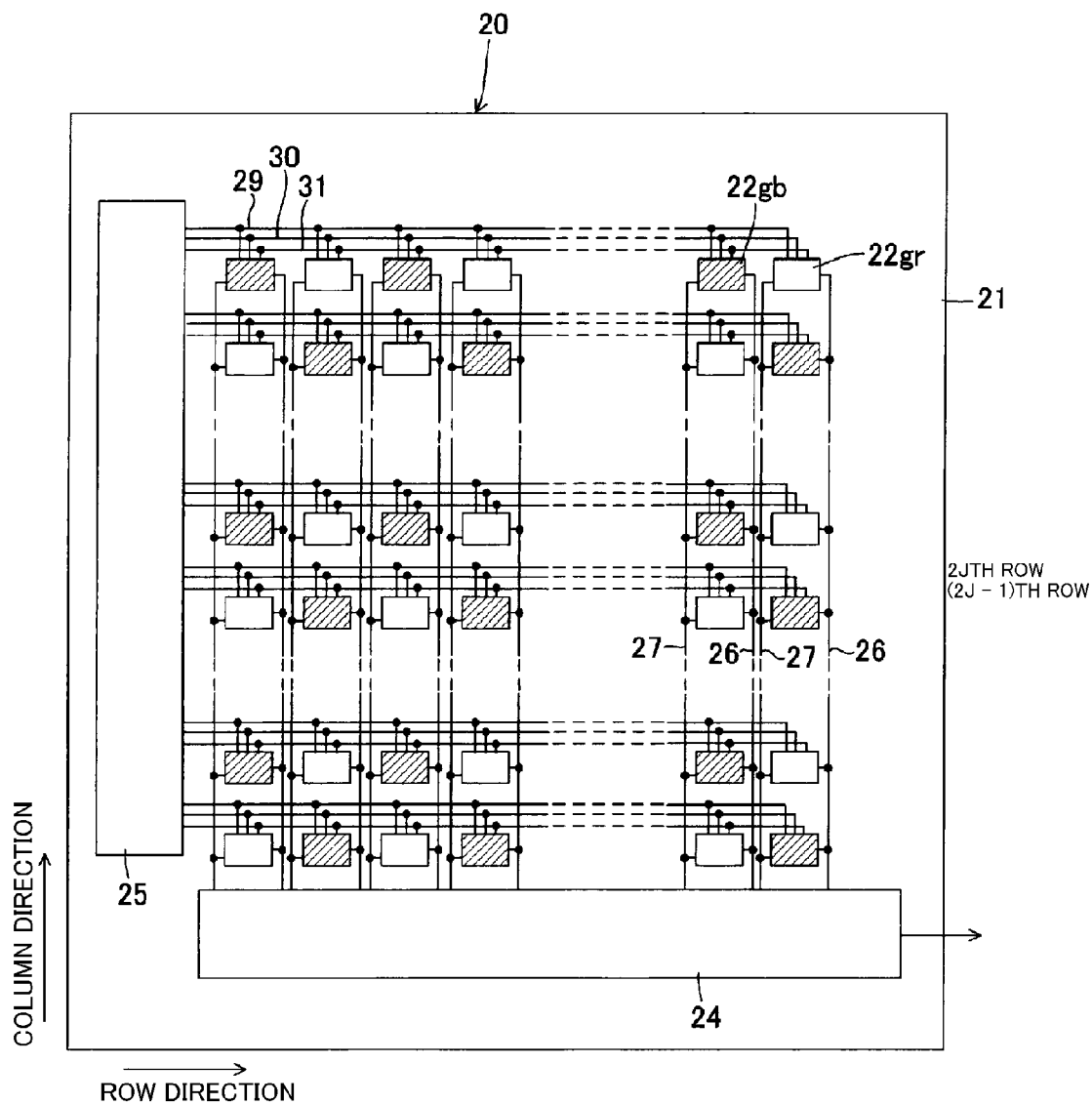
FIG. 1 schematically shows the surface of a photoelectric conversion layer stack type color solid-state imaging device according to a first embodiment of the present invention.

11: Output transistor
12: Row selection transistor
13: Reset transistor
14: Read transistor
20: Photoelectric conversion layer stack type color solid-state imaging device
21: Semiconductor substrate
22$gb$: Unit pixel of first kind
22$gr$: Unit pixel of second
24: Output signal processing section
25: Column-direction scanning control section
26: R-pixel/B-pixel column signal line
27: G-pixel column signal line 28: Color filter
29: Read signal line
30: Reset signal line
31: Row selection signal line
36: Transparent insulating layer
37: N-type region of photodiode
43: Photoelectric conversion layer for green light detection
48, 49: Terminal
50: G-pixel signal reading circuit
51: R-pixel/B-pixel signal reading circuit
53: Correlation double sampling circuit
54: Row-direction scanning control section
55: Output section
56: Column signal line selection switch circuit
57: Clamp circuit
58, 59: Sample-and-hold (SH) circuit
60: SH selection switch circuit
62: Reading output signal line
67: Clamp control switch circuit

DETAILED DESCRIPTION OF THE INVENTION

One embodiment of the present invention will be hereinafter described with reference to the drawings.

Embodiment 1

FIG. 1 schematically shows the surface of a hybrid photoelectric conversion layer stack type color solid-state imaging device according to a first embodiment of the invention. In the photoelectric conversion layer stack type color solid-state imaging device 20, plural, two-kinds of unit pixels 22gb and 22gr are arranged in square lattice form on a semiconductor substrate 21. The unit pixels 22gb which are sensitive to green (G) light and blue (B) light and the unit pixels 22gr which are sensitive to green (G) light and red (R) light are arranged in checkered form (square lattice form).

An output signal processing section 24 including a row-direction scanning control section is disposed adjacent to the bottom sideline of the semiconductor substrate 21, and a column-direction scanning control section 25 is disposed adjacent to the left sideline of the semiconductor substrate 21. Each unit pixels 22 (in the following, the term "unit pixel 22" is used in referring to both of a unit pixel 22gb and a unit pixel 22gr) is connected to the output signal processing section 24 via two column signal lines 26 and 27 and connected to the column-direction scanning control section 25 via three signal lines 29-31, which are a read signal line, a reset signal line, and a row selection signal line, respectively.

Figure 2:
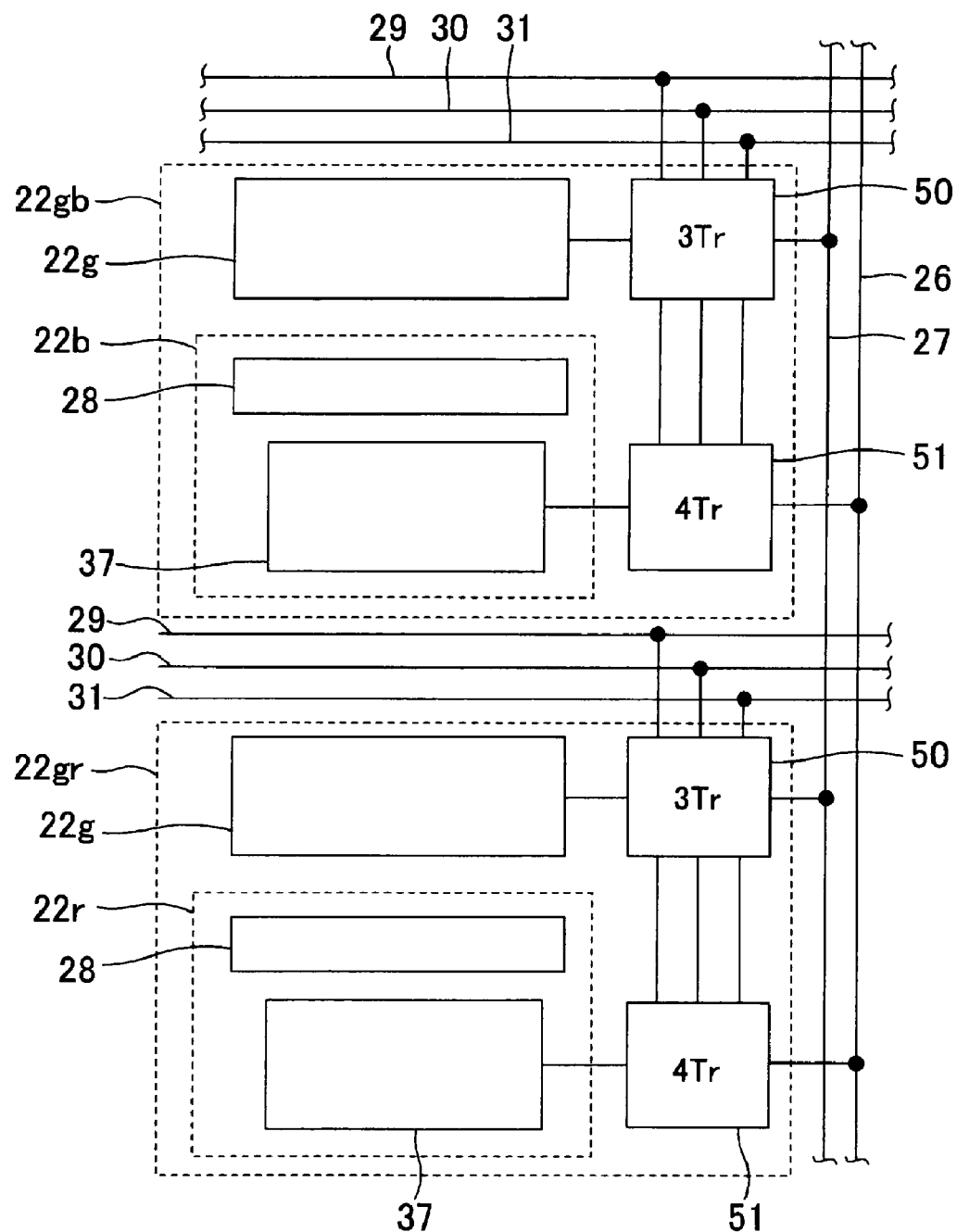
FIG. 2 schematically shows the configuration of two kinds of unit pixels shown in FIG. 1.

FIG. 2 is an explanatory diagram of each unit pixel 22gb and each unit pixel 22br shown in FIG. 1. Each unit pixel 22gb is provided with a G pixel 22g, a B pixel 22b, a 3-transistor (3Tr) signal reading circuit 50 for supplying a G signal corresponding to the amount of signal charge detected by the G pixel 22g to the column signal line 27, and a 4-transistor (4Tr) signal reading circuit 51 for supplying a B signal corresponding to the amount of signal charge detected by the B pixel 22b to the column signal line 26.

The G pixel 22g is formed in a photoelectric conversion layer which is laid on the surface of the semiconductor substrate 21 and is sensitive to green light. The B pixel 22b is composed of one photodiode 37 formed in the semiconductor substrate 21 and a color filter 28 which is laid over the photodiode 37 and under the portion, constituting the G pixel 22g, of the photoelectric conversion layer. The color filter 28 of the B pixel 22b is a blue (B) color filter.

The unit pixel 22gr has the same structure as the unit pixel 22gb except that the color filter 28 is a red (R) color filter.

Figure 3:
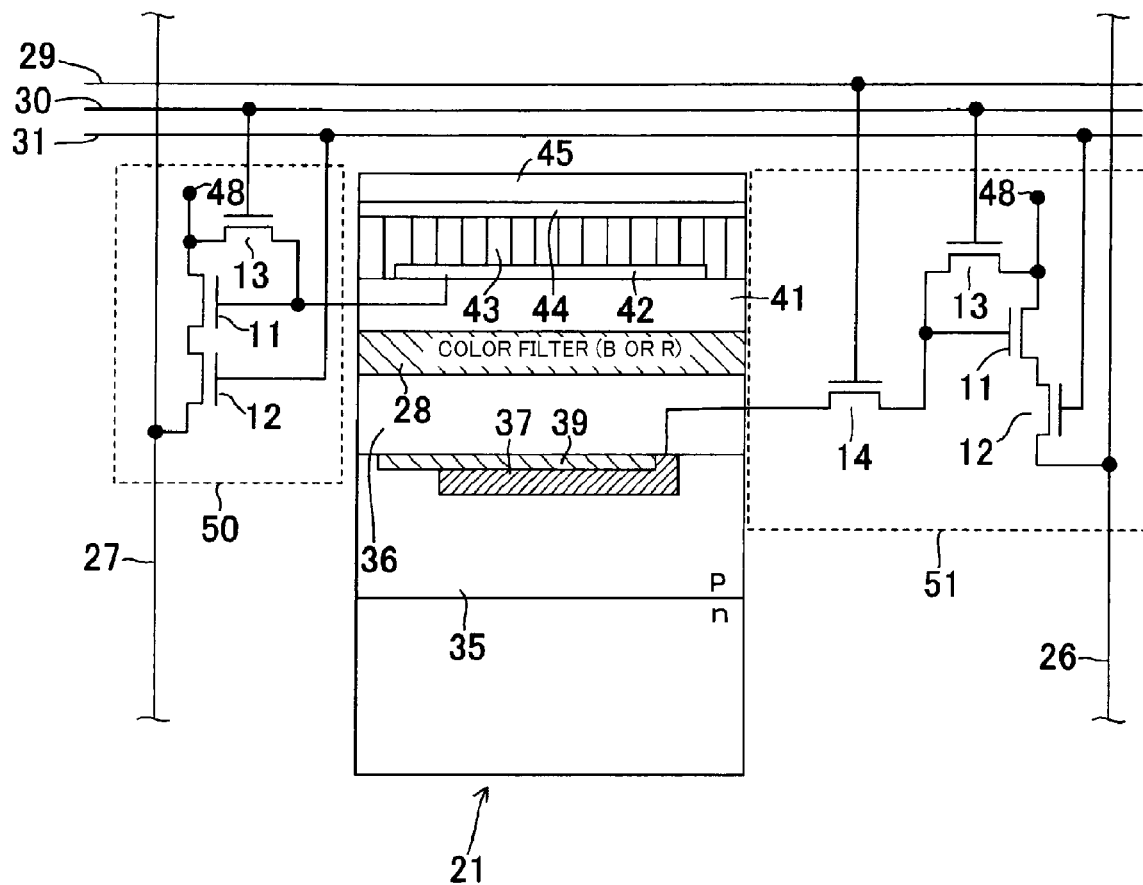
FIG. 3 is a schematic sectional view of one unit pixel and circuit diagrams of signal reading circuits of the photoelectric conversion layer stack type color solid-state imaging device of FIG. 1.

FIG. 3 is a conceptual diagram of each unit pixel shown in FIG. 1. A p-well layer 35 is formed adjacent to the surface of an n-type semiconductor substrate 21 and an n-type region 37 is formed in the p-well layer 35 adjacent to its surface. A p-type high-concentration impurity surface layer 39 for dark current suppression is formed on the surface side of the n-type region 37.

Pn junctions (i.e., photodiodes 37 (given the same symbol as the n-type region 37)) are formed between the n-type region 37 formed adjacent to the surface of the semiconductor substrate 21 and the p-type high-concentration impurity surface layer 39 (located above the n-type region 37) and between the n-type region 37 and the p-well layer 35 (located below the n-type region 37).

A transparent insulating layer 36 is laid on the surface of the semiconductor substrate 21, and a color filter layer 28 is formed on the insulating layer 36. The color filter layer 28 serves as a blue filter in the case of the unit pixel 22gb and as a red filter in the case of the unit pixel 22gr.

A transparent planarized layer 41 is laid on the color filter layer 28. A transparent pixel electrode layer 42 is laid on the insulating layer 41 and sectioned so as to correspond to the respective unit pixels. A photoelectric conversion layer 43 which is mainly sensitive to green light is laid on the pixel electrode layer 42. A transparent counter electrode layer 44 is laid on the photoelectric conversion layer 43 so as to be common to the unit pixels. A transparent protective film (insulating film) 45 is laid as a top film.

The transparent electrode layers 42 and 44 are made of a material that is low in light absorption and may be thin metal thin-films or metal compound thin-films of ITO, for example. The counter electrode layer 44 may be either a single film that is common to the unit pixels or sectioned into plural parts that correspond to the respective unit pixels, unit pixel columns, or unit pixel rows. In the latter case, wiring is made so that a single common potential can be applied to the entire counter electrode layer 44.

The photoelectric conversion layer 43 may be either a single-layer or multilayer film and is made of an organic semiconductor that is sensitive to green light, an organic material containing an organic dye that is sensitive to green light, or a like material. The photoelectric conversion layer 43 generates photocharge (electron-hole pairs) corresponding to the light quantity of received green light and thus constitutes a G pixel 22g.

The photoelectric conversion layer stack type color solid-state imaging device according to the embodiment is configured in such a manner that a signal corresponding to signal charge (in this example, charge of electrons) detected by the G pixel is read-out by the signal reading circuit 50 having the 3-transistor structure and a signal corresponding to signal charge (in this example, charge of electrons) detected by the R pixel or the B pixel is read-out by the signal reading circuit 51 having the 4-transistor structure.

Although in FIG. 3 the signal reading circuits 50 and 51 are expressed as circuit diagrams, the MOS transistors 11-14 constituting the signal reading circuits 50 and 51 are formed on the p-well layer 35 of the semiconductor substrate 21. Although omitted in FIG. 3, G signal charge flowing out of the pixel electrode layer 42 is stored in a charge storage region which is an impurity region formed on the semiconductor substrate 21. The stored charge is read out by the signal reading circuit 50. The charge storage region and the signal reading circuits 50 and 51 are formed in portions that are covered with a light shield film.

Figure 11A:
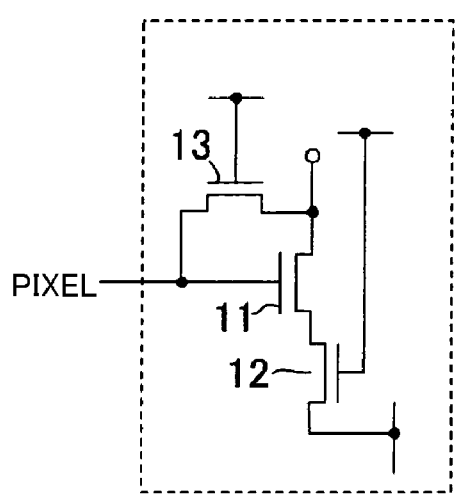
FIG. 11A is a circuit diagram of a signal reading circuit having a 3-transistor structure.
Figure 11B:
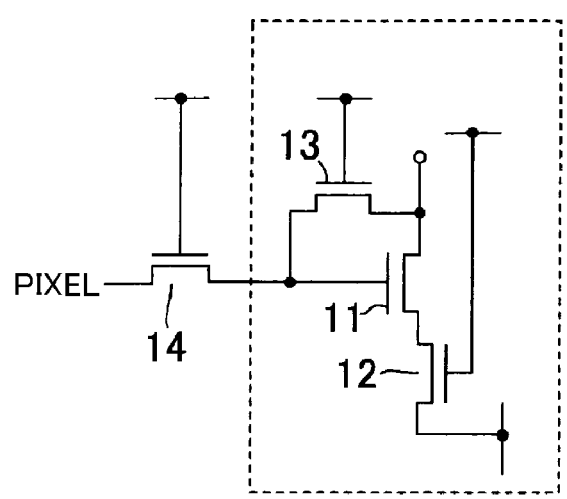
FIG. 11B is a circuit diagram of a signal reading circuit having a 4-transistor structure.

The G-pixel signal reading circuit 50 is the same as the circuit of FIG. 11B and has an output transistor 11, a row selection transistor 12, and a reset transistor 13.

A series connection of the output transistor 11 and the row selection transistor 12 is connected between a DC power terminal 48 and the column signal line 27. The gate of the output transistor 11 is connected to the pixel electrode layer 44 via the above-mentioned charge storage region of the G pixel, and the gate of the row selection transistor 12 is connected to the row selection signal line 31. The reset transistor 13 is provided between the DC power terminal 48 and the gate of the output transistor 11, and the gate of the reset transistor 13 is connected to the reset signal line 30.

The 3-transistor portion (i.e., output transistor 11, row selection transistor 12, and reset transistor 13) of the signal reading circuit 51 is the same as the signal reading circuit 50. A series connection of the output transistor 11 and the row selection transistor 12 is connected between a DC power terminal 48 and the column signal line 26. The gate of the row selection transistor 12 is connected to the row selection signal line 31. The reset transistor 13 is provided between the DC power terminal 48 and the gate of the output transistor 11, and the gate of the reset transistor 13 is connected to the reset signal line 30.

A read transistor 14 as a switching means for connecting or disconnecting the gate of the output transistor 11 to or from the n-type region 37 is connected between them, and the gate of the read transistor 14 is connected to the read signal line 29.

The reason why in this embodiment the signal reading circuit 50 of each of the pixels (G pixels) formed in the photoelectric conversion layer 43 is given the 3-transistor structure is that charges remaining in the photoelectric conversion layer 43, the pixel electrode layer 42, the charge storage region (not shown), etc. are smaller than in the case of a 4-transistor signal reading circuit and hence the degree of an after image of a G image is lowered and the degree of image quality deterioration is reduced.

The reason why in this embodiment the signal reading circuit 51 for reading signal charge of each of the pixels (R pixels and B pixels) formed by the photodiodes formed in the semiconductor substrate 21 is given the 4-transistor structure is that no charge remains in the photodiodes and noise can be made lower than in the case of the 3-transistor structure, whereby the image quality of an R image and a B image can be increased.

Figure 4:
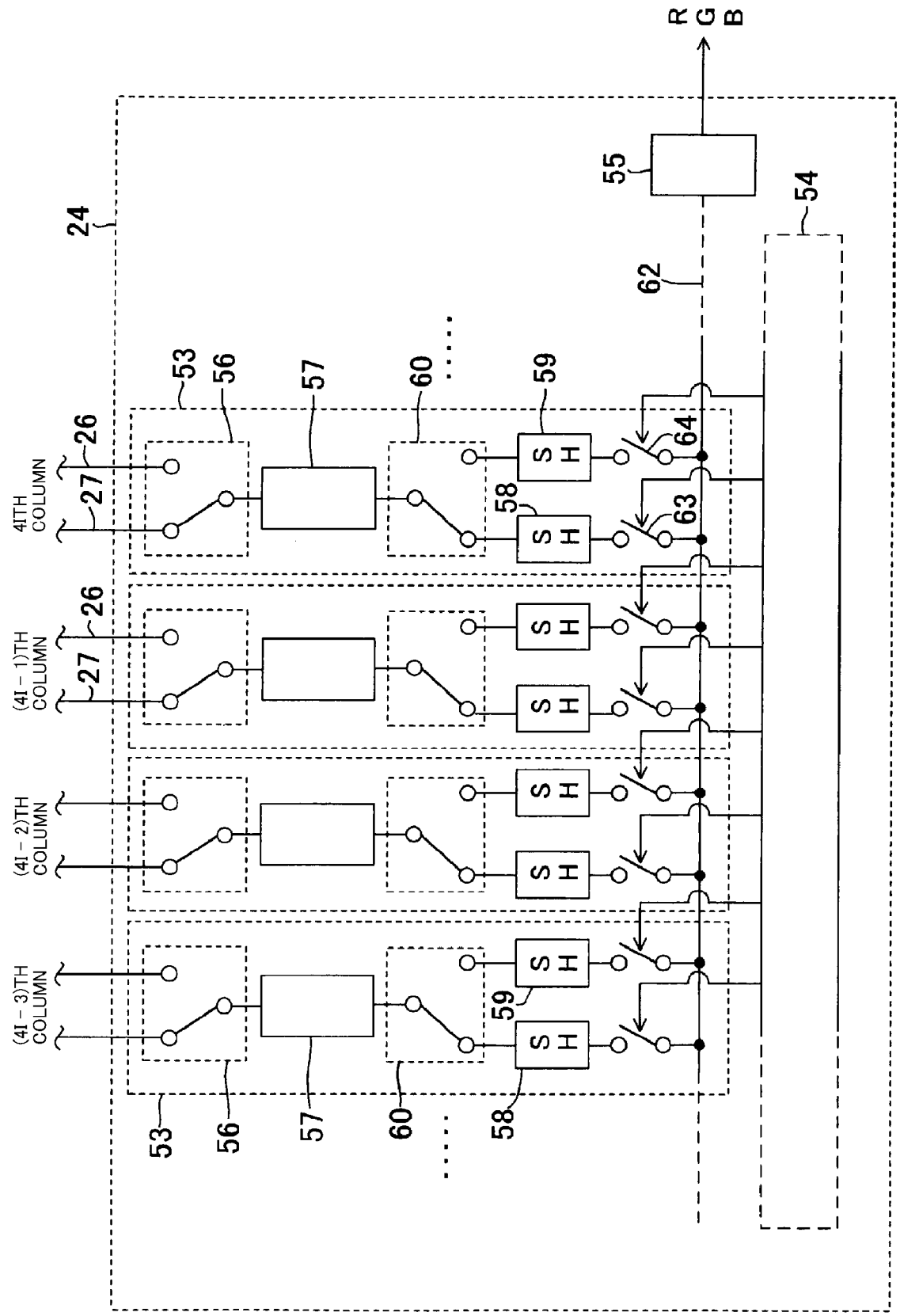
FIG. 4 shows the configuration of an important part of an output signal processing section shown in FIG. 1.

FIG. 4 shows the configuration of the output signal processing section 24. The output signal processing section 24 is equipped with correlation double sampling circuits 53 which are provided for the respective unit pixel columns, a row-direction scanning control section 54 which supplies row-direction scanning signals to the correlation double sampling circuits 53, and an output section 56 which is connected to a reading output signal line 62.

Each correlation double sampling circuit 53 is equipped with a switch circuit 56 which are connected to column signal lines 26 and 27 of a unit pixel column and connects selected one of the column signal lines 26 and 27, a clamp circuit 57 for clamping a signal selected by the switch circuit 56, two sample-and-hold (SH) circuits 58 and 59 (which function as signal memory means), an SH selection switch circuit 60 for selecting one of the two SH 58 and 59 and connecting it to the clamp circuit 57, and open/close switches (row-direction scanning switches) 63 and 64 which are provided between the reading output signal line 62 and the respective SH circuits 58 and 59. The open/close switches 63 and 64 are opened or closed according to row-direction scanning signals supplied form the row-direction scanning control section 54.

When light coming from an object shines on the photoelectric conversion layer stack type color solid-state imaging device having the above configuration, green light of the incident light is absorbed by the photoelectric conversion layer 43 and signal charges are generated in the photoelectric conversion layer 43 (electron-hole pairs are generated in the photoelectric conversion layer 43; in this embodiment, the signal charges are charges of electrons). Necessary electric fields are formed in the photoelectric conversion layer 43 by applying a voltage between the pixel electrode layer 42 and the common electrode layer 44, whereby the signal charges move quickly to the pixel electrode layer 42 along the electric field lines and then move to and stored in the above-mentioned charge storage regions. The signal charges also flow to the gates of the output transistors 11 of the signal reading circuits 50 and are stored there.

Of red light and blue light that have passed through the G pixels (photoelectric conversion layer) 43, in the unit pixels 22gb, the red light is absorbed by the blue color filters 28 and the blue light reaches the photodiodes 37. Signal charges (electrons) corresponding to blue incident light quantities are generated by the photodiodes 37 and stored in the n-type regions 37.

In the unit pixels 22gr, the blue light is absorbed by the red color filters 28 and the red light reaches the photodiodes 37. Signal charges (electrons) corresponding to red incident light quantities are generated by the photodiodes 37 and stored in the n-type regions 37.

An operation of reading image signals from the R pixels, G pixels, and B pixels will be described below.

[All Pixels Reading Operation]

The SH selection switch circuits 60 are always set so as to select the sample-and-hold circuits 58. When the column-direction scanning control section 25 outputs a row selection signal to a signal line 31 corresponding to a unit pixel row to be selected as a subject of signal reading, the row selection transistors 12 of the selected unit pixel row are rendered conductive.

Then, the column signal line selection switch circuits 56 are caused to select the column signal lines 27, whereupon G signals (image signals) corresponding to signal charges of the G pixels of the unit pixels are taken in by the clamp circuits 57 via the column signal lines 27. The clamp circuits 57 perform clamp operations.

Then, the column-direction scanning control section 25 applies a reset signal to the unit pixel row concerned, whereupon reset noises of the G pixels are output to the column signal lines 27. The sample-and-hold circuits 58 perform sample-and-hold operations on the G signals and the reset noise signals, and the G signals that have been subjected to the sample-and-hold operations are held by and stored in the sample-and-hold circuits 58.

Then, the row-direction scanning control section 54 supplies a row-direction scanning signal to a row-direction scanning switch 63 for the unit pixel row as the subject of reading, whereby the G signal held by the sample-and-hold circuit 58 is read out to the reading output signal line 62. The output section 55 performs signal processing on the G signal that has been read out to the reading output signal line 62, and outputs an output signal corresponding to the G signal to outside the imaging device 20.

The above operation is repeated in order in the row direction, whereby output signals corresponding to the G signals of one row are output to outside the imaging device 20.

Then, the column signal line selection switches 56 are switched to the column signal lines 26. The column-direction scanning control section 25 applies a reset signal to the unit pixel row concerned (in the row direction, the color pixels are arranged in order of . . . , B pixel, R pixel, B pixel, R pixel, . . . ), whereupon reset noise signals of the B pixels and the R pixels are output to the signal lines 26. The clamp circuits 57 perform clamp operations on the reset noise signals.

Then, the column-direction scanning control section 25 applies a read signal to the signal line 29 for the unit pixel row concerned, whereupon the read transistors 14 are rendered conductive. Blue signals are output from the B pixels 22*b* of the unit pixels 22*gb* to the column signal lines 26, and R signals are output to the column signal lines 26 from the R pixels of the unit pixels 22*gr* which are adjacent to the unit pixels 22*gb*.

The B signals and the R signals are taken in by the sample-and-hold circuits 58 of the respective correlation double sampling circuits 53. Each of the sample-and-hold circuits 58 performs sample-and-hold processing on the B signal or the P, signal just taken in and the reset noise signal of the B pixel or R pixel that was read out immediately before, and the thus-processed B signal or R signal is held by and stored in the sample-and-hold circuit 58.

Then, the row-direction scanning control section 54 applies a row-direction scanning signal to a scanning switch 63, whereupon the signal (B signal or R signal) held by the sample-and-hold circuit 58 is read cut to the reading output signal line 62. The output section 55 performs signal processing on the signal that has been read out to the reading output signal line 62, and outputs a resulting output signal to outside the imaging device 20. The above operation is repeated in order in the row direction, whereby B signals and R signals of one row are output to outside the imaging device 20.

The above operation is repeated while the unit pixel row as the subject of reading is switched, whereby color signals (G signals, R signals, and B signals) of all the pixels of one picture are output.

In this embodiment, each unit pixel includes two color pixels (i.e., G and B or G and R). Whereas every unit pixel includes a G pixel, the number of B pixels or R pixels is ½ of the number of all unit pixels. However, since the resolution is almost determined by the number of G pixels, the fact that the number of B pixels or R pixels is ½ of the number of all unit pixels causes almost no decrease in resolution. In addition, since only one photodiode is provided in each unit pixel, the number of manufacturing steps is made smaller and hence the manufacture is made easier. Therefore, a high yield can be realized and the cost of the imaging device can be reduced.

[Color Signals Sum Reading Operation]

The column-direction scanning control section 25 selects a (2J−1)th unit pixel row, where J is a positive integer. When the column-direction scanning control section 25 outputs a row selection signal to this unit pixel row, the row selection transistors 12 of the unit pixel row are rendered conductive. At this time, the column signal line selection switch circuits 56 select the column signal lines 27 and the SH selection switch circuits 60 select the sample-and-hold circuits 58.

As a result, G signals corresponding to signal charge amounts of the respective G pixels 22*g* of the unit pixel row are output to the column signal lines 27. The clamp circuits 57 perform clamp operations.

Then, the column-direction scanning control section 25 applies a reset signal to the unit pixel row concerned, whereupon reset noise signals of the G pixels are output to the column signal lines 27. The sample-and-hold circuits 58 perform sample-and-hold operations on the signals and the reset noise signals, and G signals as processing results are held by and stored in the sample-and-hold circuits 58.

Then, the column-direction scanning control section 25 outputs a row selection signal to the 2Jth unit pixel row to select it, whereupon the row selection transistors 12 of the 2Jth unit pixel row are rendered conductive. The SH selection switch circuits 60 are switched to the sample-and-hold circuits 59.

As a result, G signals (image signals) corresponding to signal charge amounts of the respective G pixels of the 2Jth unit pixel row are output to the column signal lines 27. The clamp circuits 57 perform clamp operations. Then, the column-direction scanning control section 25 applies a reset signal to the 2Jth unit pixel row, whereupon reset noise signals of the G pixels are output to the column signal lines 27. The sample-and-hold circuits 59 perform sample-and-hold operations, and the G signals that have been subjected to the sample-and-hold operations are held by and stored in the sample-and-hold circuits 59.

Then, the row-direction scanning control section 54 supplies row-direction scanning signals to row-direction scanning switches 63 and 64, whereupon the signals being held by the sample-and-hold circuits 58 and 59 are read out to the reading output signal lines 62.

First, row-direction scanning signals are applied simultaneously to row-direction scanning switches 63 and 64 (four switches in total) corresponding to two adjoining unit pixel columns ((4I−3)th and (4I−2)th unit pixel columns) where I is a positive integer. As a result, the G signals of the four G pixels (i.e., pixels (4I−3, 2I−1), (4I−3, 2J), (4I−2, 2J−1), and (4I−2, 2J) are simultaneously output to the reading output signal lines 62 and added together. The output section 55 performs signal processing on an addition signal of the four G pixels that has been read out to the reading output signal line 62 and outputs a resulting signal to outside the imaging device 20.

Then, the row-direction scanning control section 54 simultaneously applies row-direction scanning signals to the row-direction scanning switches 63 and 64 (four switches in total) corresponding to the two adjoining unit pixel columns ((4I−1)th and 4Ith unit pixel columns). As a result, the G signals of the four G pixels (i.e., pixels (4I−1, 2J−1), (4I−1, 2J), (4I, 2J−1), and (4I, 2J)) are simultaneously output to the reading output signal lines 62 and added together. The output section 55 performs signal processing on an addition signal and outputs a resulting signal to outside the imaging device 20. The above operation is repeated, whereby 4-pixel addition G signals of one row are output to outside the imaging device 20.

Then, the column-direction scanning control section 25 outputs a row selection signal to the (2J−1)th unit pixel row to select it, whereupon the row selection transistors 12 of the unit pixel row concerned are rendered conductive. At this time, the column signal line selection switch circuits 56 select the column signal lines 26. The SH selection switch circuits 60 of the (4I−3)th and (4I−1)th columns are switched to the sample-and-hold circuits 58 and the SH selection switch circuits 60 of the (4I−2)th and 4Ith columns are switched to the sample-and-hold circuits 59.

Then, the column-direction scanning control section 25 applies a reset signal to the (2J−1)th unit pixel row, whereupon reset noise signals of the B pixels and the R pixels of the unit pixel row concerned are output to the column signal lines 26. The clamp circuits 57 perform clamp operations.

Then, the column-direction scanning control section 25 applies a read signal to the (2J−1)th unit pixel row, whereupon B signals and R signals corresponding to signal charge amounts of the B pixels and R pixels are output to the column signal lines 26. The sample-and-hold circuits 58 of the (4I−

3)th and (4I−1)th columns and the sample-and-hold circuits 59 of the (4I−2)th and 4Ith columns perform sample-and-hold operations.

Figures 5, 6:
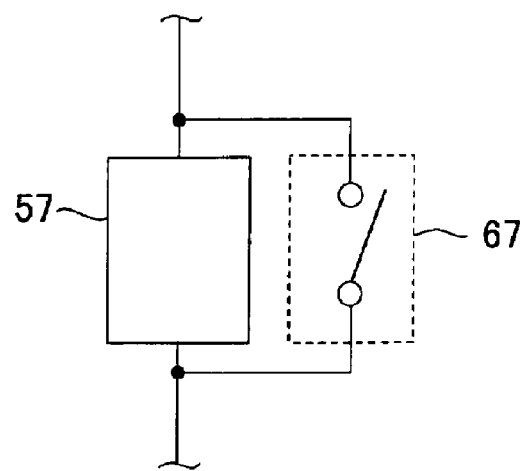
FIG. 5 is an explanatory diagram of pixel addition of the photoelectric conversion layer stack type color solid-state imaging device according to the first embodiment of the invention.
FIG. 6 shows the configuration of an important part of an output signal processing section of a photoelectric conversion layer stack type color solid-state imaging device according to a second embodiment of the invention.

Now assume that the (2J−1) row, (4J−3) column color pixel is an R pixel as shown in FIG. 5. Then, R signals are held by and stored in the SH circuits 58 of the (4I−3)th and (4I−1)th columns and B signals are held by and stored in the SH circuits 59 of the (4I−2)th and 4Ith columns.

Then, the column-direction scanning control section 25 selects the 2Jth unit pixel row. As shown in FIG. 5, in the 2Jth unit pixel row, the arrangement of the B pixels and the R pixels is opposite to that in the (2J−1)th unit pixel row.

When the column-direction scanning control section 25 outputs a row selection signal to the 2Jth unit pixel row, the row selection transistors 12 of this unit pixel row are rendered conductive. The SH selection switch circuits 60 of the (4I−3) th and (4I−1)th columns are switched to the SH circuits 59 and the SH selection switch circuits 60 of the (4I−2)th and 4Ith columns are switched to the SH circuits 58.

Then, the column-direction scanning control section 25 applies a reset signal to the 2Jth unit pixel row, whereupon reset noise signals are output to the column signal lines 26. The clamp circuits 57 perform clamp operations. Then, the column-direction scanning control section 25 applies a read signal to the 2Jth unit pixel row, whereupon B signals and R signals (image signals) corresponding to signal charge amounts of the B pixels and the R pixels are output to the column signal lines 26. The sample-and-hold circuits 59 of the (4I−3)th and (4I−1)th columns and the sample-and-hold circuits 58 of the (4I−2)th and 4Ith columns perform sample-and-hold operations.

As a result, in the above example, the B signals are held by and stored in the SH circuits 59 of the (4I−3)th and (4I−1)th columns and the R signals are held by and stored in the SH circuits 58 of the (4I−2)th and 4Ith columns. That is, the R signals are held by and stored in the SH circuits 58 of the respective columns and the B signals are held by the stored in the SH circuits 59 of the respective columns.

Then, the row-direction scanning control section 54 simultaneously applies row-direction scanning signals to row-direction scanning switches 63 and 64, whereupon the signals being held by the sample-and-hold circuits 58 and 59 are read out to the reading output signal line 62.

First, row-direction scanning signals are applied simultaneously to the row-direction scanning switches 63 of the (4I−3)th, (4I−2)th, (4I−1)th, and 4Ith columns. As a result, the R signals of the four R pixels shown in FIG. 5 are simultaneously output from the respective SH circuits 58 to the reading output signal lines 62 and added together. The output section 55 performs signal processing on an addition R signal that has been read out to the reading output signal line 62, and outputs a resulting signal to outside the imaging device 20.

Then, row-direction scanning signals are applied to the row-direction scanning switches 64 of the (4I−3)th, (4I−2)th, (4I−1)th, and 4Ith columns. As a result, this time, the B signals of the four B pixels shown in FIG. 5 are simultaneously output from the respective SH circuits 59 to the reading output signal lines 62 and added together. The output section 55 performs signal processing on an addition B signal that has been read out to the reading output signal line 62, and outputs a resulting signal to outside the imaging device 20. The above operation is repeated in order in the row direction, whereby addition B signals and addition R signals of one row are output to outside the imaging device 20.

The same operation as described above is performed again for the (2J+1)th and the (2J+2)th unit pixel rows. In this manner, addition signals of the individual color pixels of all the unit pixel rows are read out in order.

As described above, in this embodiment, signal charges of the R pixels, the G pixels, and the B pixels of all the unit pixels are read out with signal addition without wasting any of those. Even for a dark scene, four times higher sensitivity can be obtained in the above example because 4-pixel addition is performed. An image can be taken with high sensitivity even without using flash light.

Embodiment 2

FIG. 6 shows the configuration of an important part of an output signal processing section used in a photoelectric conversion layer stack type color solid-state imaging device according to a second embodiment of the invention. In each correlation double sampling circuit of the output signal processing section of this embodiment, a clamp control switch circuit 67 for making effective or breaking a bypass route of a clamp circuit 57 is provided in the bypass route. The other part of the configuration is the same as in the first embodiment shown in FIGS. 1-5.

The first embodiment and this embodiment employ the signal reading circuit 50 having the 3-transistor structure as a signal reading circuit for reading signal charge of each G pixel. Whereas this is intended to lower the degree of an afterimage, the 3-transistor signal reading circuit 50 has a problem that random noise that is superimposed on an output signal of the signal reading circuit 50 cannot be canceled out unlike in the case of the 4-transistor signal reading circuit.

This is because reset noise to be subjected to correlation double sampling is different from reset noise included in an image signal. More specifically, reset noise included in an image signal is reset noise of the immediately preceding frame and reset noise to be subjected to correlation double sampling is reset noise that is obtained immediately after reading of the image signal. Therefore, in principle, random noise contained in the reset signal cannot be canceled out even if they are subjected to subtraction. This problem is solved by this embodiment.

In the photoelectric conversion layer stack type color solid-state imaging device according to this embodiment, if the clamp control switch circuits 67 are always opened, the clamp circuits 57 are always effective, which enables entirely the operation as in the first embodiment. As for B signals and R signals, reset noise containing random noise can be removed by ordinary correlation double sampling. Therefore, signal processing on B signals and R signals is performed in the state that the switch circuits 67 are opened.

Where the clamp control switch circuits 67 are closed, the clamp circuits 57 are rendered non-operational and a low-noise reading operation (described below) can be performed. In the low-noise reading operation, in each of an all pixels reading operation and a sum reading operation, output signals corresponding to reset noises and output signals corresponding to image signals containing reset noises of the immediately preceding frame are output for G signals.

Reset noise signals of the immediately preceding frame and image signals containing reset noises of the immediately preceding frame are subjected to subtraction processing outside the photoelectric conversion layer stack type color solid-state imaging device, whereby low-noise G image signals are obtained.

[Low-Noise Reading Operation of all Pixel Reading]

The SH selection switch circuits 60 always select the sample-and-hold circuits 58. The column-direction scanning control section 25 outputs a row selection signal to a unit pixel row as a subject of reading, whereupon the row selection transistors 12 of the unit pixel row concerned are rendered conductive.

Then, the column signal line selection switch circuits 56 are caused to select the column signal lines 27 and the clamp control switch circuits 67 are closed.

As a result, G signals (image signals) corresponding to signal charge amounts of the G pixels are output to the column signal lines 27. The sample-and-hold circuits 58 perform sample-and-hold operations. Reset noises containing random noises of the immediately preceding frame are superimposed on these image signals. As a result of the performance of the sample-and-hold operations, the G signals that have been subjected to the signal processing are held by and stored in the sample-and-hold circuits 58.

Then, the row-direction scanning control section 54 supplies a row-direction scanning signal to a row-direction scanning switch 63, whereupon the signal being held by the sample-and-hold circuit 58 is read out to the reading output signal line 62. The output section 55 performs signal processing on the G signal that has been read out to the reading output signal line 62, and outputs the thus-processed G signal to outside the imaging device. The G signal that has been read out to outside the imaging device is stored in a frame memory (not shown). This operation is repeated in order in the row direction, whereby signals corresponding to the G signals of one row are output and stored in the frame memory.

Then, the column signal line selection switch circuits 56 are switched so as to select the column signal lines 26. Furthermore, the clamp control switch circuits 67 are opened.

When the column-direction scanning control section 25 applies a reset signal to the unit pixel row concerned, reset noise signals of the B pixels and the R pixels are output to the column signal lines 26. The clamp circuits 57 perform clamp operations. Then, the column-direction scanning control section 25 applies a read signal to the unit pixel row concerned, whereupon B signals and R signals (image signals) corresponding signal charge amounts of the B pixels and the R pixels are output to the column signal lines 26. The sample-and-hold circuits 58 perform sample-and-hold operations. As a result, the B signals and the R signals that have been subjected to the signal processing are held by and stored in the sample-and-hold circuits 58.

Then, the row-direction scanning control section 54 supplies a row-direction scanning signal to a row-direction scanning switch 63, whereupon the signal being held by the sample-and-hold circuit 58 is read out to the reading output signal line 62. The output section 55 performs signal processing on the signal that has been read out to the reading output signal line 62, and outputs the thus-processed signal to outside the imaging device. This operation is repeated in order in the row direction, whereby signals corresponding to the B signals and the R signals of one row are output in order.

Then, the column signal line selection switch circuits 56 are caused to select the column signal lines 27 and the clamp control switch circuits 67 are closed. The column-direction scanning control section 25 applies a reset signal to the unit pixel row concerned, whereupon reset noises containing random noises of the G pixels are output to the column signal lines 27. The sample-and-hold circuits 58 perform sample-and-hold operations. As a result, the reset noise signals of the G pixels that have been subjected to the signal processing are held by and stored in the sample-and-hold circuits 58.

Then, the row-direction scanning control section 54 supplies a row-direction scanning signal to a row-direction scanning switch 63, whereupon the signal being held by the sample-and-hold circuit 58 is read out to the reading output signal line 62. The output section 55 performs signal processing on the signal that has been read out to the reading output signal line 62, and outputs the thus-processed signal to outside the imaging device. The thus-output signal corresponding to the reset noise of the G pixel is stored in a frame memory (not shown). This operation is repeated in order in the row direction, whereby signals corresponding to rest noise signals of the G pixels of one row are stored in the frame memory.

The above operation is repeated while the unit pixel row as the subject of reading is switched, whereby output signals corresponding to color signals of all the unit pixels and output signals corresponding to reset noises of the G pixels are output to outside the imaging device.

In the photoelectric conversion layer stack type color solid-state imaging device according to this embodiment, G signals and reset noise signals that have been read-out from the G pixels and stored in the frame memories provided outside are processed by a signal processing section which is provided outside the imaging device. That is, the reset noise signals of the immediately preceding frame which are stored in the frame memory and the image signals of the G pixels containing reset noises of the immediately preceding frame which are stored in the other frame memory are subjected to subtraction processing. As a result, random noises which cannot be reduced in the first embodiment can be reduced, which makes it possible to increase the S/N ratio of an image of a dark object and to thereby obtain a good color image.

The above operation is an operation without an electronic shutter operation. Where an electronic shutter operation is performed, electronic shuttering causes a row selection signal and a reset signal to be applied to a unit pixel row from which signal charges of the G pixels are to be read out, whereby output signals corresponding to reset noises of the unit pixel row as a subject of reading are output. Naturally, an operation of reading signal charges of the B pixels and the R pixels of the same unit pixel row is also performed.

[Low-Noise Reading Operation of Sum Reading]

First, the column-direction scanning control section 25 selects a (2J–1)th unit pixel row, whereupon the row selection transistors 12 of the unit pixel row selected by a row selection signal are rendered conductive. The column signal line selection switch circuits 56 are caused to select the column signal lines 27, and the SH selection switch circuits 60 are caused to select the SH circuits 58. The clamp control switch circuits 67 are closed.

As a result, G signals (image signals) corresponding to signal charges of the G pixels are output to the column signal lines 27. The sample-and-hold circuits 58 perform sample-and-hold operations, whereby the resulting G signals (image signals) the G pixels of the (2J–1)th row are held by and stored in the sample-and-hold circuits 58.

Then, the column-direction scanning control section 25 selects the 2Jth unit pixel row, whereupon the row selection transistors 12 of the unit pixel row selected by a row selection signal are rendered conductive. The SH selection switch circuits 60 select the SH circuits 59.

As a result, G signals (image signals) corresponding to signal charges of the G pixels of the 2Jth row are output to the column signal lines 27. The G signals (image signals) that have been subjected to sample-and-hold processing are held by and stored in the sample-and-hold circuits 59.

Then, as in the first embodiment, four adjoining row-direction scanning switches 63, 64, 63, and 64 are closed simultaneously, whereupon the G signals (image signals) of the four pixels that are adjacent to each other in both of the column direction and the row direction are output simultaneously from the SH circuits 58, 59, 58, and 59 to the reading output signal line 62 and added together. An addition signal is output to outside the device via the output section 55. The above operation is repeated in order in the row direction, whereby addition output signals of one row are output to outside the device and held by an external frame memory.

Then, the (2J−1)th unit pixel row is selected, the column signal line selection switch circuits 56 are caused to select the column signal lines 26, and the clamp control switch circuits 67 are opened. As in the first embodiment, B signals and R signals are read out to outside the device. This operation will not be described because it has already been described in the first embodiment.

The 2Jth unit pixel row is selected by the column-direction scanning control section 25 when the B signals and the R signals have been read out. Therefore, the column-direction scanning control section 25 then selects the (2J−1)th unit pixel row. The column signal line selection switch circuits 56 are caused to select the column signal lines 27, the clamp control switch circuits 67 are closed, and the SH selection switch circuits 60 are caused to select the SH circuits 58.

The column-direction scanning control section 25 applies a reset signal to the selected unit pixel row, whereupon reset noises of the G pixels of the (2J−1)th row are output to the column signal lines 27 and subjected to sample-and-hold operations in the sample-and-hold circuits 58. The thus-processed signals are held by and stored in the sample-and-hold circuits 58.

Then, the column-direction scanning control section 25 selects the 2Jth unit pixel row and the SH selection switch circuits 60 are caused to select the SH circuits 59. When the column-direction scanning control section 25 applies a reset signal to the 2Jth unit pixel row, reset noises of the G pixels of the 2Jth row are output to the column signal lines 27 and subjected to sample-and-hold operations in the sample-and-hold circuits 59. The thus-processed reset noises are held by and stored in the sample-and-hold circuits 59.

Then, as in the first embodiment, four adjoining row-direction scanning switches 63, 64, 63, and 64 are closed simultaneously, whereupon the reset noise signals of the four G pixels that are adjacent to each other in both of the column direction and the row direction are output simultaneously from the SH circuits 58, 59, 58, and 59 to the reading output signal line 62 and added together. An addition signal is output to outside the device via the output section 55. The above operation is repeated in order in the row direction, whereby addition output signals of the reset noise signals of one row are output to outside the device and held by an external frame memory.

The above reading operation is repeated while the unit pixel row as the subject of reading is switched, whereby output signals corresponding to color signals of all the pixels of one picture and output signals corresponding to reset noises of the G pixels are output to outside the device.

The signal processing section provided outside the device performs subtraction processing on an addition reset noise signal of four G pixels of the immediately preceding frame which is stored in the frame memory and an addition image signal of the four G pixels containing reset noises of the immediately preceding frame which is stored in the other frame memory. As a result, random noises which cannot be reduced in the first embodiment can be reduced, which makes it possible to increase the S/N ratio of an image of a dark object and to thereby obtain a good color image.

The above operation is an operation without an electronic shutter operation. Where an electronic shutter operation is performed, electronic shuttering causes a row selection signal and a reset signal to be applied to a unit pixel row from which signal charges of the G pixels are to be read, whereby output signals corresponding to reset noises of the unit pixel row as a subject of reading are output.

In the first and second embodiments, four open/close switches (row-direction scanning switches) 63 and 64 for pixel addition (color signal addition) are opened or closed simultaneously. Alternatively, scanning signals of different timings may be applied to the switches 63 and 64 consecutively so that signals are output to the reading output signal line 62 with consecutive timings. This is included in the concept "simultaneousness."

Embodiment 3

Figure 7:
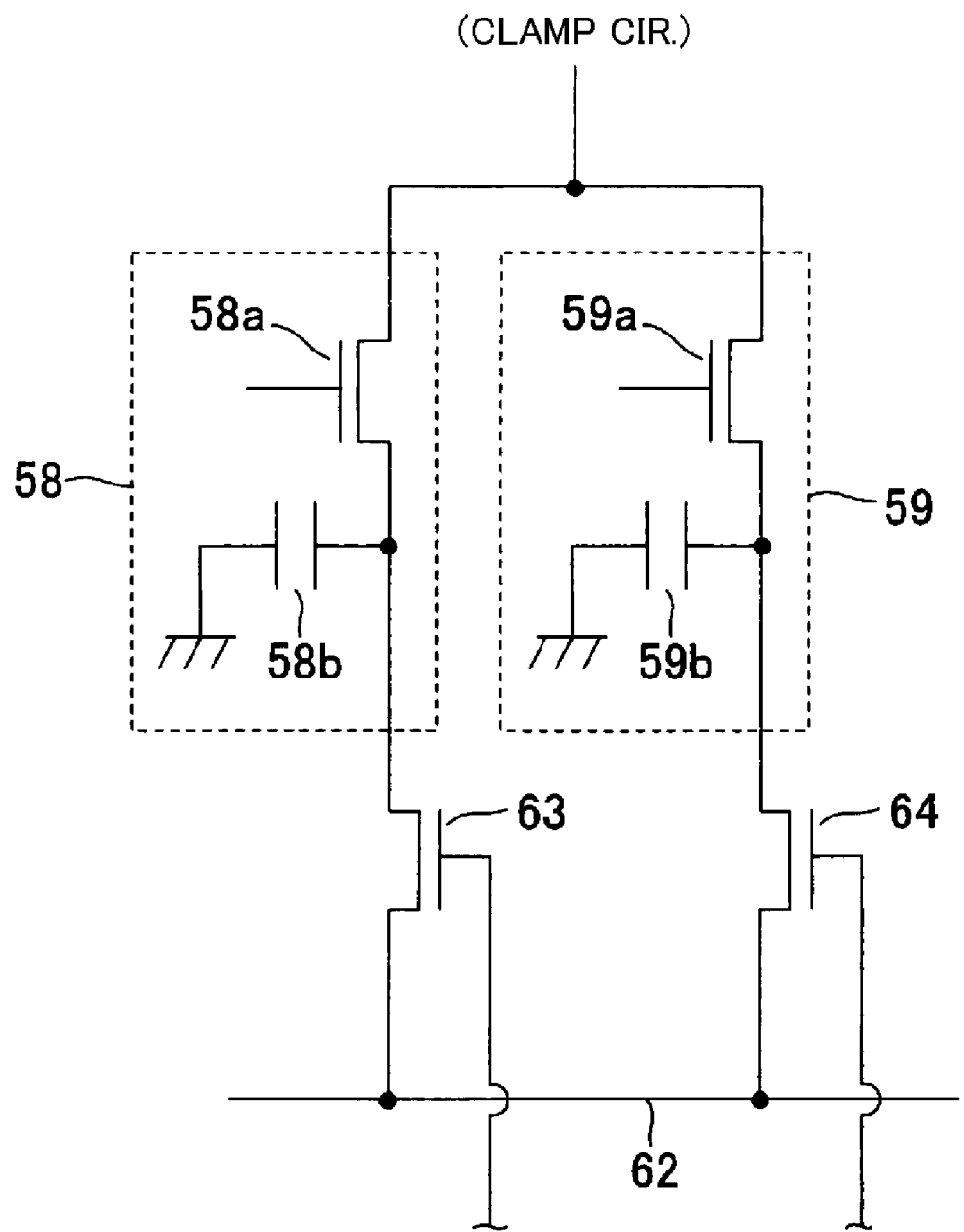
FIG. 7 shows the configuration of an important part of an output signal processing section of a photoelectric conversion layer stack type color solid-state imaging device according to a third embodiment of the invention.

FIG. 7 shows the configuration of an important part of an output signal processing section of a photoelectric conversion layer stack type color solid-state imaging device according to a third embodiment of the invention. Whereas in the first and second embodiments the SH selection switch circuits 60 are provided independently of the sample-and-hold circuits 58 and 59, in this embodiment sampling transistors 58a and 59a of the sample-and-hold circuits 58 and 59 also serve as SH selection switches (see FIG. 7).

An output signal of each clamp circuit 57 is supplied to both sample-and-hold circuits 58 and 59. The sample-and-hold circuit 58 performs a sample-and-hold operation if a sampling pulse is applied to the gate of the sampling transistor 58a, and the sample-and-hold circuit 59 performs a sample-and-hold operation if a sampling pulse is applied to the gate of the sampling transistor 59a. In this manner, the control using a sampling pulse makes it possible to select one of the sample-and-hold circuits 58 and 59 and perform a sample-and-hold operation simultaneously, Symbols 58b and 59b denote capacitors.

Embodiment 4

Figure 8:
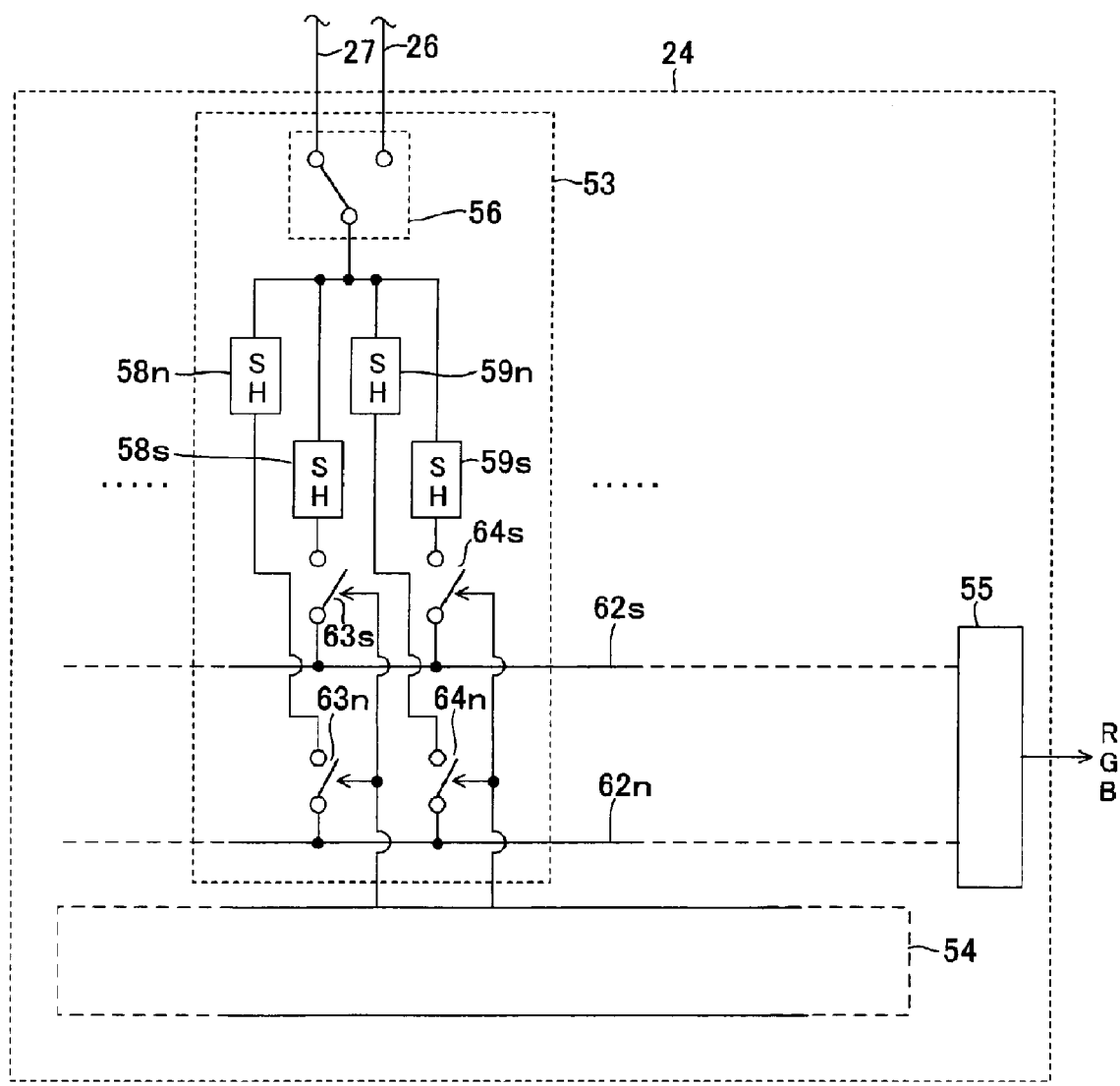
FIG. 8 shows the configuration of an important part of an output signal processing section of a photoelectric conversion layer stack type color solid-state imaging device according to a fourth embodiment of the invention.

FIG. 8 shows the configuration of an important part of an output signal processing section of a photoelectric conversion layer stack type color solid-state imaging device according to a fourth embodiment of the invention. The other part of the configuration is the same as in the first to third embodiments.

The output signal processing section 24 of this embodiment is equipped with sampling circuits 53 which are provided for the respective unit pixel columns, a row-direction scanning control section 54, and an output section 55 which is connected to two output signal lines 62n and 62s and outputs a difference signal of signals that are read out to the respective signal lines 62n and 62s.

Each sampling circuit 53 is composed of a switch 56 for selecting one of the column signal lines 26 and 27, four parallel sample-and-hold (SH) circuits 58n, 58s, 59n, and 59s to be connected to the column signal line selected by the switch 56, a row-direction scanning switch 63n for connecting or disconnecting the SH circuit 58n to or from the reset noise output signal line 62n according to a row-direction scanning signal, a row-direction scanning switch 64n for connecting or disconnecting the SH circuit 59n to or from the reset noise output signal line 62n according to a row-direction scanning signal, a row-direction scanning switch 63s for connecting or disconnecting the SH circuit 58s to or from the image signal output signal line 62s according to a row-direction scanning signal, and a row-direction scanning switch 64s for connecting or disconnecting the SH circuit 59s to or from the image signal output signal line 62s according to a row-direction scanning signal.

In the first to third embodiments, each circuit 53 which performs noise reduction processing is composed of the clamp circuit and the sample-and-hold circuits. The configuration of the circuit for performing noise reduction processing is not limited to this type. The circuit 53 of this embodiment is configured in such a manner that a signal corresponding to reset noise and a signal corresponding to an image signal containing reset noise are held by and stored in separate SH circuits and then subjected to subtraction.

That is, this embodiment is provided with the sample-and-hold circuits 58n and 59n for holding and storing a signal corresponding to reset noise and the sample-and-hold circuits 58s and 59s for holding and storing a signal corresponding to an image signal containing reset noise.

A signal being held by the sample-and-hold circuits 58n or 59n is read out to the reset noise output signal line 62n, and a signal being held by the sample-and-hold circuits 58s or 59s is read out to the image signal output signal line 62s. The differential-input output section 55 outputs a difference signal of the signals on the signal lines 62s and 62n. This difference signal is a noise-reduction-processed signal.

The concept of this embodiment can likewise be applied to the second embodiment. Where it is applied to the second embodiment, for example, if only the reset noise sample-and-hold circuits 58n and 59n are rendered operational for a G signal, a signal corresponding to reset noise is obtained. If only the image signal sample-and-hold circuits 58s and 59s are rendered operational, a signal corresponding to an image signal containing reset noise is obtained.

Embodiment 5

Figure 9A:
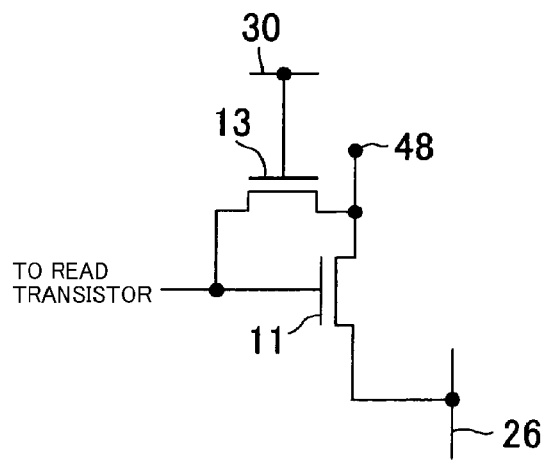
FIG. 9A is a circuit diagram of each of signal reading circuits for pixels formed in a semiconductor substrate of a photoelectric conversion layer stack type color solid-state imaging device according to a fifth embodiment of the invention.

FIG. 9A is a circuit diagram of a signal reading circuit used in a photoelectric conversion layer stack type color solid-state imaging device according to a fifth embodiment of the invention. The device structure is the same as in the above-described embodiments. This signal reading circuit is used as each of signal reading circuits for reading color image signals corresponding to signal charges that are detected by the pixels formed on the semiconductor substrate side (i.e., R pixels and B pixels).

The signal reading circuit of FIG. 9A is configured in such a manner that the row selection transistor 12 is removed from the signal reading circuit of FIG. 11B or the 4-transistor signal reading circuit 51 of FIG. 3 and the output transistor 11 is directly connected to the column signal line 26. Furthermore, instead of the selection control by the row selection transistor 12, the column-direction scanning control section 25 controls the potential of the terminal 48 which is connected to the drain of the reset transistor 13.

The signal reading circuit of this embodiment is rendered non-operational in the following manner. When the potential of the terminal 48 is set at a ground voltage or a low voltage and a reset signal is applied to the reset transistor 13, the output transistor 11 is turned off. Even if the potential of the terminal 48 is returned to a high voltage for a normal operation in the above setting, the non-operational state of the signal reading circuit is maintained.

This signal reading circuit is made operational in the following manner. The potential of the terminal 48 is set at the high voltage for a normal operation and a reset signal is applied to the reset transistor 13. As a result, the output transistor 11 is turned on and the signal reading circuit is made operational.

As described above, the number of transistors of each signal reading circuit of this embodiment is smaller by one than the signal reading circuit having the 4-transistor structure. Therefore, the circuit area of each signal reading circuit which is provided near the associated R pixel and B pixel can be reduced. As a result, the photodetecting areas of each R pixel and each B pixel can be increased, which means increase in sensitivity and saturation output voltage.

Embodiment 6

Figure 9B:
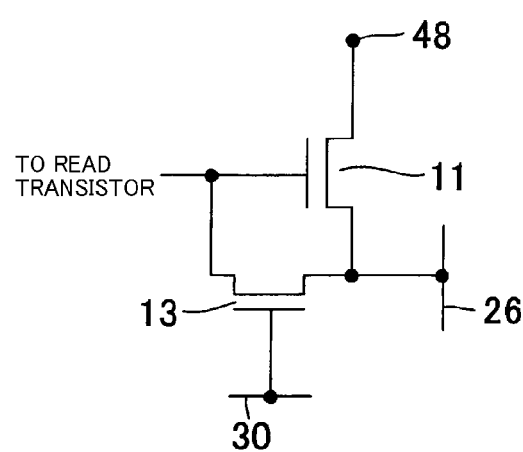
FIG. 9B is a circuit diagram of each of signal reading circuits for pixels formed in a semiconductor substrate of a photoelectric conversion layer stack type color solid-state imaging device according to a sixth embodiment of the invention.

FIG. 9B is a circuit diagram of a signal reading circuit used in a photoelectric conversion layer stack type color solid-state imaging device according to a sixth embodiment of the invention. Whereas in each signal reading circuit of the fifth embodiment the reset transistor 13 is provided between the gate and the drain of the output transistor 11, in this embodiment the reset transistor 13 is provided between the gate and the source of the output transistor 11. A DC voltage is applied to the terminal 48 which is connected to the drain of the output transistor 11.

The signal reading circuit of this embodiment is rendered non-operational in the following manner. When the potential of the column signal line 26 is set at a ground voltage or a low voltage and a reset signal is applied to the reset transistor 13, the output transistor 11 is turned off. Even if a color signal of another unit pixel row comes to be applied to the column signal line 26 in the above setting, the non-operational state of the signal reading circuit is maintained.

This signal reading circuit is made operational in the following manner. The voltage applied to the terminal 48 or a high voltage that is close to it is applied to the column signal line 26 and a reset signal is applied to the reset transistor 13. As a result, the output transistor 11 is turned on and the signal reading circuit is made operational. This embodiment provides the same advantage as the fifth embodiment.

Embodiment 7

Figure 10:
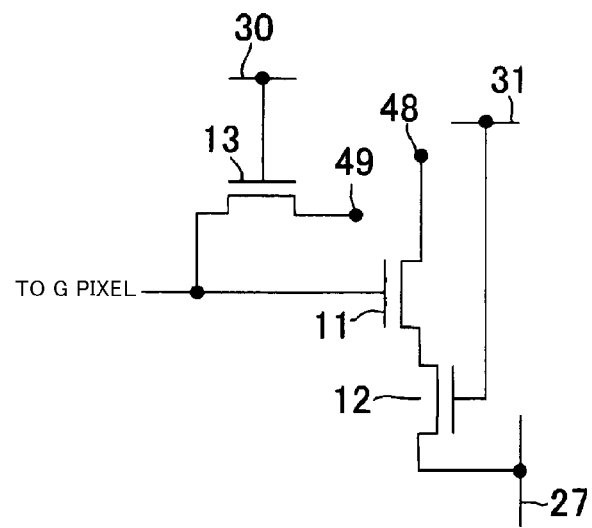
FIG. 10 is a circuit diagram of each of signal reading circuits for reading signals corresponding to hole signal charges that are detected by pixels that are formed in a photoelectric conversion layer of a photoelectric conversion layer stack type color solid-state imaging device according to a seventh embodiment of the invention.

FIG. 10 is a circuit diagram of a signal reading circuit used in a photoelectric conversion layer stack type color solid-state imaging device according to a seventh embodiment of the invention. The device structure is the same as in the above-described embodiments. The photoelectric conversion layer stack type color solid-state imaging device according to this embodiment is configured in such a manner that charges of the holes of electron-hole pairs generated in the pixels (G pixels) formed in the photoelectric conversion layer 43 are used as signal charges and signals corresponding to the amounts of holes are read-out by the signal reading circuits of the embodiment.

The signal reading circuit of FIG. 10 is basically the same in configuration as the 3-transistor signal reading circuit 50 of FIG. 2, and is different from the latter in that a terminal 49 that is connected the drain of the reset transistor 13 is separated from the terminal 48 which is connected to the drain of the output transistor 11.

In the thus-configured signal reading circuit, a color signal corresponding to the amount of hole signal charge of the G pixel is supplied to the column signal line 27 in the following manner. A high voltage for a normal operation is applied to the terminal 48 and a medium voltage is applied to the terminal 49. When a reset signal is applied to the reset transistor 13, a medium voltage is applied to the gate of the output transistor 11. Therefore, even if positive signal charge (of holes) of the G pixel flows into the gate of the output transistor 11 and the gate voltage is thereby increased, the source follower circuit of the output transistor 11 operates normally.

Although the above embodiments are directed to the case that the output signals are analog signals, they naturally be digital signals. In the latter case, a configuration is possible in which an ADC (analog/digital converter) is provided in the output section of the output signal processing section and an analog signal is converted into a digital signal collectively. Another possible configuration is such that ADCs are provided downstream of the respective circuits 53 and analog signals are converted into digital signals on a column-by-column basis.

The above embodiments do not refer to the use of microlenses. However, microlenses may be provided to increase the light collection efficiency of the B pixels and the R pixels which are formed in the semiconductor substrate. The microlenses are provided over the insulating film 45 as top lenses or provided inside the insulating layer 36 or 41 as inner lenses. The sensitivities of the R pixels and the B pixels can thus be increased further.

Although the above-described embodiments are such that the R pixels and the B pixels are formed by photodiodes and the G pixels are formed in the photoelectric conversion layer, this is just an example. The concepts of the above embodiments can be applied to general photoelectric conversion layer stack type color solid-state imaging devices in which light of one of the three primary colors is detected by pixels formed in a photoelectric conversion layer and light of the other two colors is detected by photodiodes.

In the above embodiments, the color filters 28 are the blue filters and the red filters. Alternatively, since green light is absorbed by the photoelectric conversion layer 43, cyan (Cy) filters which transmit blue light and green light and cut red light may be used in place of the blue filters and yellow (Ye) filters which transmit red light and green light and cut blue light may be used in place of the red filters.

Furthermore, one of the blue filters and the red filters may be omitted. The color-filter-omitted photodiodes serve as Mg pixels for detecting light quantities of magenta (Mg) which is a mixed color of blue and red and the color-filter-associated photodiodes serve as the R pixels or the B pixels. Therefore, B signals or R signals that are not produced directly and contained in signals produced by the Mg pixels can easily be obtained by computations.

Although in the above embodiments the color filters are disposed between the photoelectric conversion layer and the photodiodes, the same effect can be obtained even if they are disposed over the photoelectric conversion layer.

As described above, according to the embodiments of the invention, low-noise color signals can be read-out from the R pixels and the B pixels (or Mg pixels) which are provided on the semiconductor substrate side since R and B (or Mg) signals are read-out by the signal reading circuits having the 4-transistor structure. As for the G pixels which are formed in the photoelectric conversion layer, non-read-out charges (residual charges) which may cause a G-color afterimage can be reduced because G signals are read-out by the signal reading circuits having the 3-transistor structure Good color images can thus be taken.

In the embodiment in which for an output signal of each G pixel from which random noise cannot be removed in principle by a correlation double sampling circuit a reset noise signal and an image signal containing reset noise of the immediately preceding frame are output separately, random noise of each G-pixel signal can be reduced to a large extent by performing subtraction processing on a reset noise signal of the immediately preceding frame and an image signal by using a frame memory or the like outside the imaging device. This makes it possible to take even better color images.

In the above embodiments, an addition signal is obtained for G pixels in which two pixels are arranged in the row direction and two pixels are arranged in the column direction and addition signals are obtained for B pixels and R pixels in which four pixels are arranged in the row direction and two pixels are arranged in the column direction (the number of pixels involved in actual addition processing (sum processing) is four). However, the invention is not limited to such a case. For example, addition processing involving four pixels in the column direction is enabled by increasing the number of sample-and-hold circuits in each circuit 53 from two to four and increasing the number of terminals of each SH selection switch circuits to four. Furthermore, various kinds of addition are enabled by changing the combination of row-direction scanning switches to which row-direction scanning signals are applied simultaneously.

As described above, each embodiments of the invention makes it possible to choose between the all pixels reading operation and the color signals sum reading operation. Therefore, in a digital camera incorporating the photoelectric conversion layer stack type color solid-state imaging device according to each embodiment, an image having high image quality (a large S/N ratio) can be taken with high sensitivity by choosing the color signals sum reading operation even in taking a moving image or a still image of a dark scene in which the use of flash light is prohibited. If the all pixels reading operation is chosen in taking a still image of a sufficiently bright scene, a still image having high image quality and a high resolution can be taken.

Facilitating manufacture and capable of taking color images having high image quality with high sensitivity, the photoelectric conversion layer stack type color solid-state imaging device according to the invention is useful when used in place of conventional CCD solid-state imaging devices, CMOS solid-state imaging devices, etc.

This application is based on Japanese Patent application JP 2006-166105, filed Jun. 15, 2006, the entire content of which is hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A color solid state imaging device comprising a semiconductor substrate and plural unit pixels of two kinds that are a first kind and a second kind arranged like a two-dimensional array, in which each unit pixel of the first kind consists of a pixel of a first color and a pixel of a second color for detecting incident light quantities of the first color and the second color, respectively, and each unit pixel of the second kind consists of a pixel of the first color and a pixel of a third color for detecting incident light quantities of the first color and the third color, respectively, the pixels of the first color are provided in a photoelectric conversion layer provided above the semiconductor substrate, the pixels of the second color and the pixels of the third color are formed by respective of photodiodes provided in the semiconductor substrate, and detection signals of the pixels of the first color, the second color, and the third color are read-out by sets of signal reading circuits which are provided for the respective unit pixels, the color solid state imaging device comprising an output signal processing section which comprises:

signal memory means provided for respective columns of the unit pixels, for holding signals read-out from the pixels of the same color of the same unit pixel row, respectively; and row-direction scanning control means for switching between an all pixels reading operation in which the signals held by the respective signal memory means are read out individually and output to the outside and a sum reading operation in which, among the signals held by the respective signal memory means, signals held by signal memory means corresponding to adjoining unit pixels are read out simultaneously and output to the outside.

2. The color solid state imaging device according to claim 1, wherein plural signal memory means are provided for each unit pixel column, and that the output signal processing section further comprises memory means changeover switches for causing the plural signal memory means to hold signals that are read-out from pixels of the same color that are adjacent to each other in a column direction of the unit pixels.

3. The color solid state imaging device according to claim 1, wherein each of the signal memory means comprises first signal memory means for holding a signal containing reset noise read-out from a pixel and a second signal memory means for holding a reset noise signal read-out from the pixel, and that the output signal processing section outputs a difference signal of a signal read from the first signal memory means and a signal read from the second signal memory means.

4. The color solid state imaging device according to claim 1, wherein each of the signal reading circuits for reading detection signals of the pixels of the first color is formed by three transistors which are a reset transistor, a row selection transistor, and an output transistor, and each of the signal reading circuits for reading detection signals of the pixels of the second color and each of the signal reading circuits for reading detection signals of the pixels of the third color are formed by four transistors which are a read transistor, a reset transistor, a row selection transistor, and an output transistor.

5. The color solid state imaging device according to claim 1, wherein the output signal processing section further comprises switching means for taking in one of output signals of the signal reading circuits for reading detection signals of the pixels of the first color and output signals of the signal reading circuits for reading detection signals of the pixels of the second color or the third color by selecting them by switching.

6. The color solid state imaging device according to claim 1, wherein the output signal processing section further comprises circuits for performing sample-and-hold processing on detection signals of the pixels of the first color that have been taken in and circuits for performing correlation double sampling on detection signals of the pixels of the first color and the second color that have been taken in.

7. The color solid state imaging device according to claim 6, wherein the correlation double sampling is performed by clamp circuits for clamping input signals and sample-and-hold circuits for sample-and-holding outputs of the clamp circuits and the sample-and-hold processing is performed by the sample-and-hold circuits with the clamp circuits bypassed by bypass circuits.

8. The color solid state imaging device according to claim 6, wherein after the signal reading circuits have supplied detection signals of the pixels of the first color to the output signal processing section before the signal reading circuits read next detection signals of the pixels of the first color, the signal reading circuits supply reset noise signals to the output signal processing section.

9. The color solid-state imaging device according to claim 4, wherein the row selection transistor of each of the 4-transistor signal reading circuits is omitted and instead a voltage applied to a drain terminal of the reset transistor is controlled variably.

10. The color solid-state imaging device according to claim 1, wherein the photoelectric conversion layer has a structure that a single-layer or multilayer organic semiconductor layer is sandwiched between a transparent pixel electrode layer and a transparent counter electrode layer.

11. The color solid-state imaging device according to claim 1, wherein first color filters that transmit light of the second color are laid over the photodiodes for the pixels of the second color and second color filters that transmit light of the third color are laid over the photodiodes for the pixels of the third color.

12. The color solid-state imaging device according to claim 11, characterized in that the first color filters or the second color filters are transparent layers.

13. The color solid-state imaging device according to claim 1, wherein the first color, the second color, and the third color are green, blue, and red, respectively.

14. The color solid-state imaging device according to claim 1, wherein the pixels of the first color, the second color, and the third color detect incident light quantities as amounts of electrons.

15. The color solid-state imaging device according to claim 1, wherein the pixels of the first color detect incident light quantities as amounts of holes, and the pixels of the second color and the third color detect incident light quantities as amounts of electrons.

16. The color solid-state imaging device according to claim 1, wherein output signals of the signal processing sections are analog signals.

17. The color solid-state imaging device according to claim 1, wherein output signals of the output signal processing sections are digital signals.

* * * * *